US008315588B2

(12) United States Patent
Randazzo

(10) Patent No.: US 8,315,588 B2
(45) Date of Patent: Nov. 20, 2012

(54) RESISTIVE VOLTAGE-DOWN REGULATOR FOR INTEGRATED CIRCUIT RECEIVERS

(75) Inventor: Todd A. Randazzo, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 2582 days.

(21) Appl. No.: 10/835,936

(22) Filed: Apr. 30, 2004

(65) Prior Publication Data

US 2005/0245226 A1    Nov. 3, 2005

(51) Int. Cl.
H04B 1/16 (2006.01)
(52) U.S. Cl. .......... 455/343.1; 455/572; 455/127.1; 323/281; 323/282
(58) Field of Classification Search .......... 455/343.1, 455/343.2, 343.5, 127.1, 572; 323/281, 282
See application file for complete search history.

(56) References Cited

U.S. PATENT DOCUMENTS

| | | | | |
|---|---|---|---|---|
| 5,010,292 A * | 4/1991 | Lyle, Jr. | | 323/274 |
| 5,119,015 A * | 6/1992 | Watanabe | | 323/313 |
| 5,365,161 A * | 11/1994 | Inoue et al. | | 323/282 |
| 5,563,501 A * | 10/1996 | Chan | | 323/282 |
| 5,570,004 A * | 10/1996 | Shibata | | 323/303 |
| 5,751,639 A * | 5/1998 | Ohsawa | | 365/226 |
| 5,939,867 A * | 8/1999 | Capici et al. | | 323/277 |
| 6,087,813 A * | 7/2000 | Tobita | | 323/280 |
| 6,373,233 B2 * | 4/2002 | Bakker et al. | | 323/282 |
| 6,407,638 B1 * | 6/2002 | Migliavacca | | 330/289 |
| 6,465,994 B1 * | 10/2002 | Xi | | 323/274 |
| 6,522,111 B2 * | 2/2003 | Zadeh et al. | | 323/277 |
| 6,570,371 B1 * | 5/2003 | Volk | | 323/315 |
| 6,583,607 B1 * | 6/2003 | Marty et al. | | 323/273 |
| 6,650,175 B2 * | 11/2003 | Messager | | 327/541 |
| 6,665,525 B2 * | 12/2003 | Dent et al. | | 455/108 |
| 6,690,147 B2 * | 2/2004 | Bonto | | 323/280 |
| 6,703,813 B1 * | 3/2004 | Vladislav et al. | | 323/270 |
| 6,765,374 B1 * | 7/2004 | Yang et al. | | 323/280 |
| 6,806,693 B1 * | 10/2004 | Bron | | 323/280 |
| 6,842,068 B2 * | 1/2005 | Perrier et al. | | 327/540 |
| 6,867,573 B1 * | 3/2005 | Carper | | 323/277 |
| 6,897,715 B2 * | 5/2005 | Barber et al. | | 327/541 |
| 6,968,218 B2 * | 11/2005 | Petty | | 455/572 |
| 6,975,099 B2 * | 12/2005 | Wu et al. | | 323/280 |
| 7,023,181 B2 * | 4/2006 | Nakata | | 322/28 |
| 7,151,365 B2 * | 12/2006 | Nakata | | 323/314 |
| 7,173,402 B2 * | 2/2007 | Chen et al. | | 323/280 |
| 7,199,567 B2 * | 4/2007 | Eberlein | | 323/276 |
| 2001/0011921 A1 * | 8/2001 | Ooishi | | 327/540 |
| 2002/0060558 A1 * | 5/2002 | Oki et al. | | 323/282 |
| 2002/0118002 A1 * | 8/2002 | Luo | | 323/316 |
| 2002/0121882 A1 * | 9/2002 | Matsuo et al. | | 323/266 |
| 2002/0130646 A1 * | 9/2002 | Zadeh et al. | | 323/275 |
| 2003/0146740 A1 * | 8/2003 | Chang et al. | | 323/281 |
| 2003/0218450 A1 * | 11/2003 | Bonte | | 323/273 |
| 2004/0008015 A1 * | 1/2004 | Pons et al. | | 323/274 |

(Continued)

*Primary Examiner* — Edward Urban
*Assistant Examiner* — Rui Hu
(74) *Attorney, Agent, or Firm* — David D. Brush; Westman, Champlin & Kelly, P.A.

(57) ABSTRACT

A receiver circuit is provided on an integrated circuit. The receiver circuit includes first and second power supply terminals, a ground supply terminal, a resistive element coupled between the first and second power supply terminals, and a receiver biased between the second power supply terminal and the ground supply terminal. The receiver draws a bias current through the resistive element, which varies as a positive function with a voltage on the second power supply terminal. The voltage on the second power supply terminal varies as an inverse function of the bias current.

17 Claims, 5 Drawing Sheets

U.S. PATENT DOCUMENTS

| | | | |
|---|---|---|---|
| 2004/0061485 A1* | 4/2004 | Hamon et al. | 323/280 |
| 2004/0145361 A1* | 7/2004 | Owen | 323/313 |
| 2004/0174149 A1* | 9/2004 | Agari et al. | 323/271 |
| 2005/0057234 A1* | 3/2005 | Yang et al. | 323/273 |
| 2005/0189930 A1* | 9/2005 | Wu et al. | 323/280 |
| 2006/0186869 A1* | 8/2006 | Telecco | 323/282 |

* cited by examiner

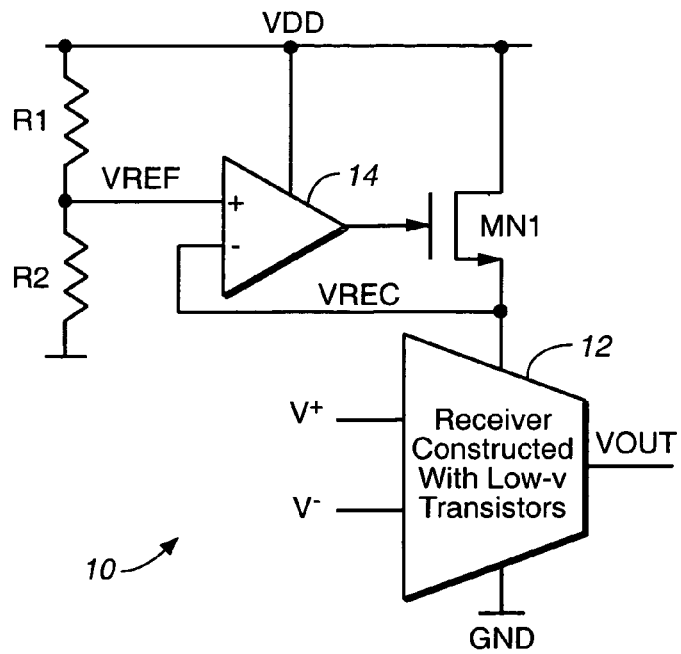
FIG._1
*(PRIOR ART)*
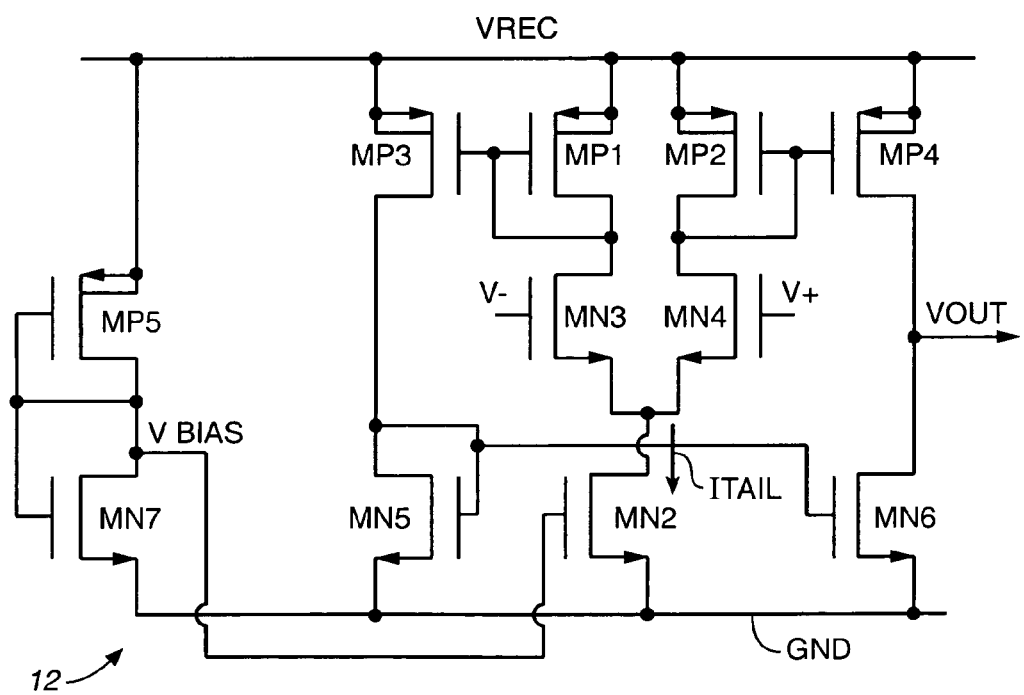
FIG._2

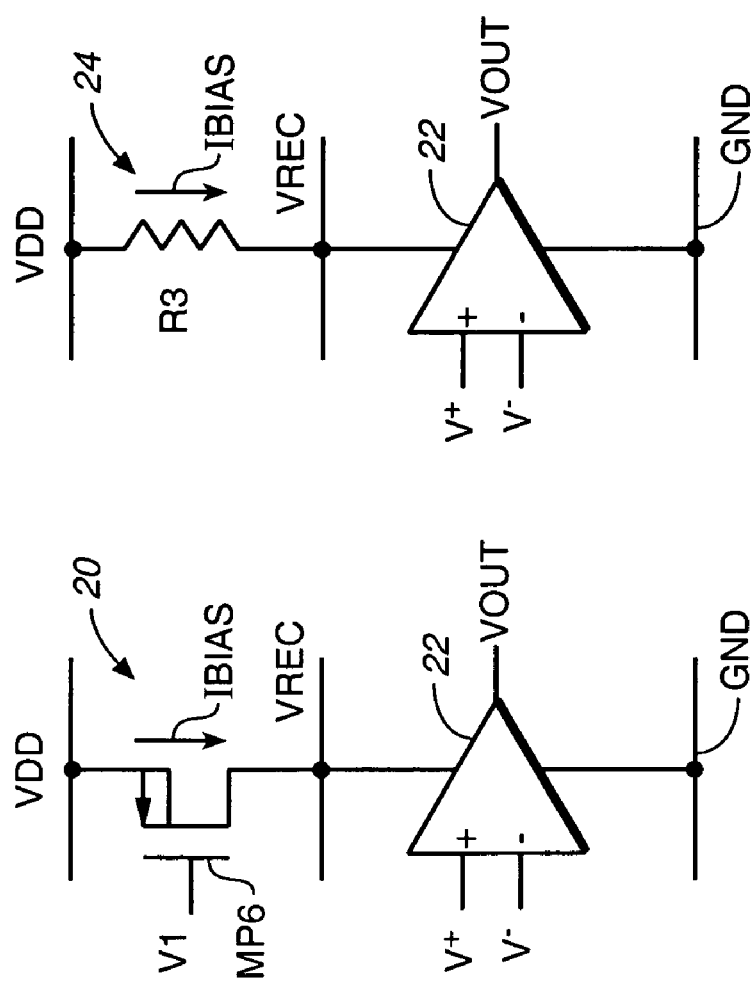
FIG._3  FIG._4  FIG._5

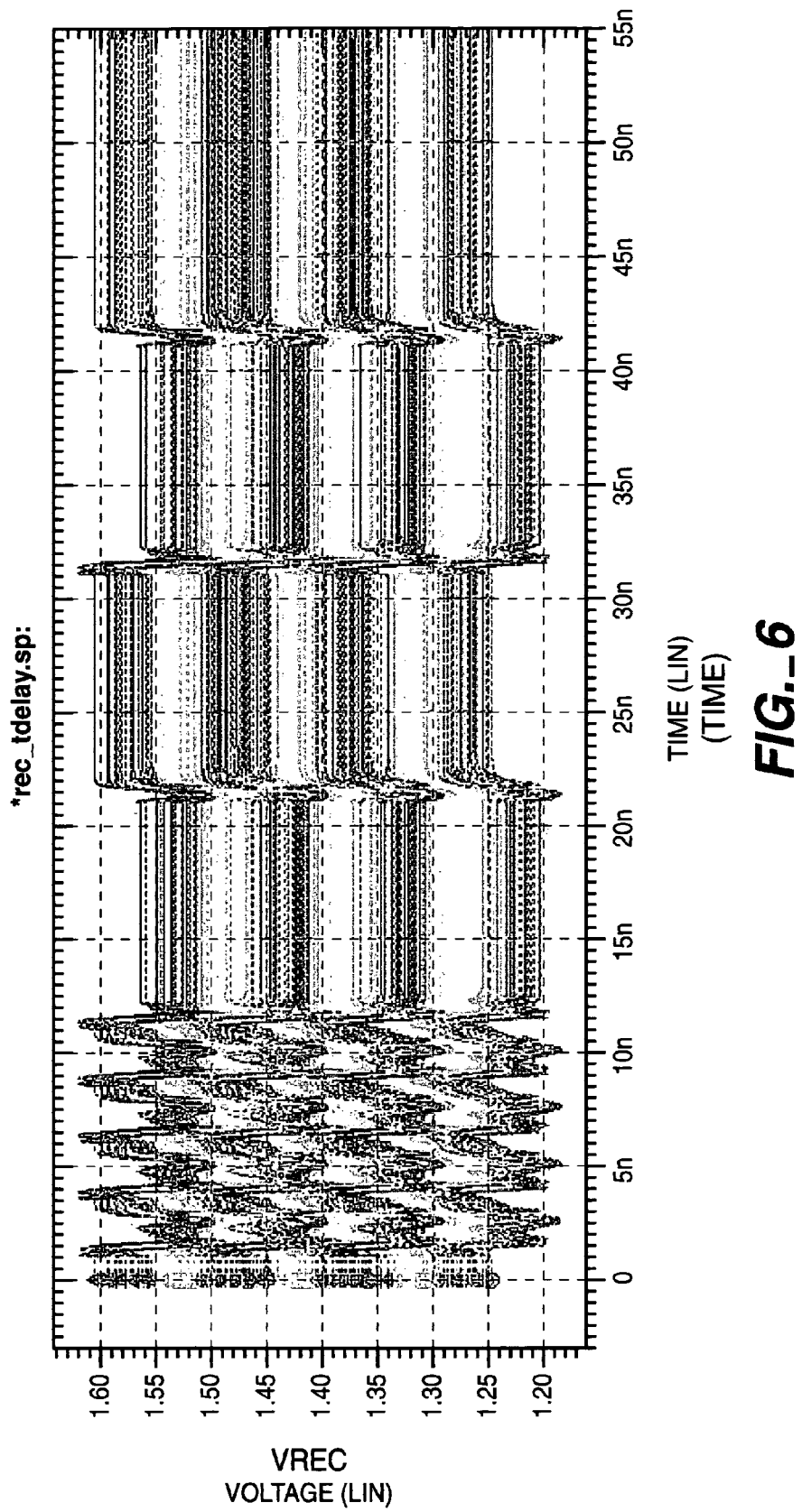
FIG._6

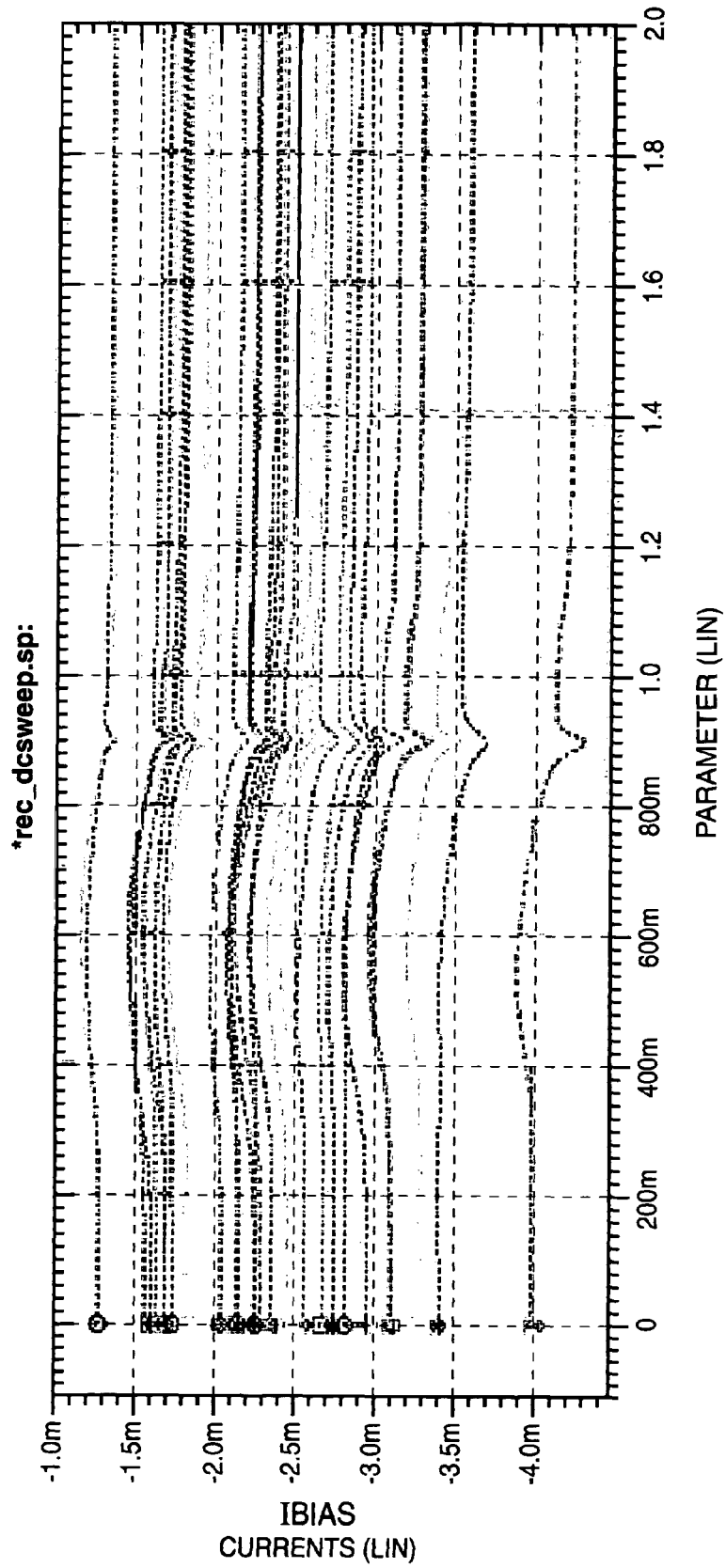
FIG._7

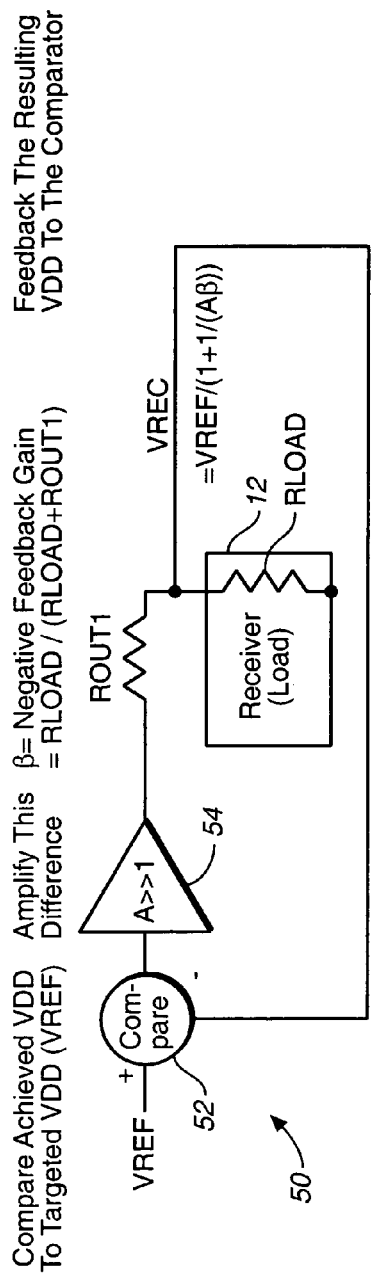
FIG._8
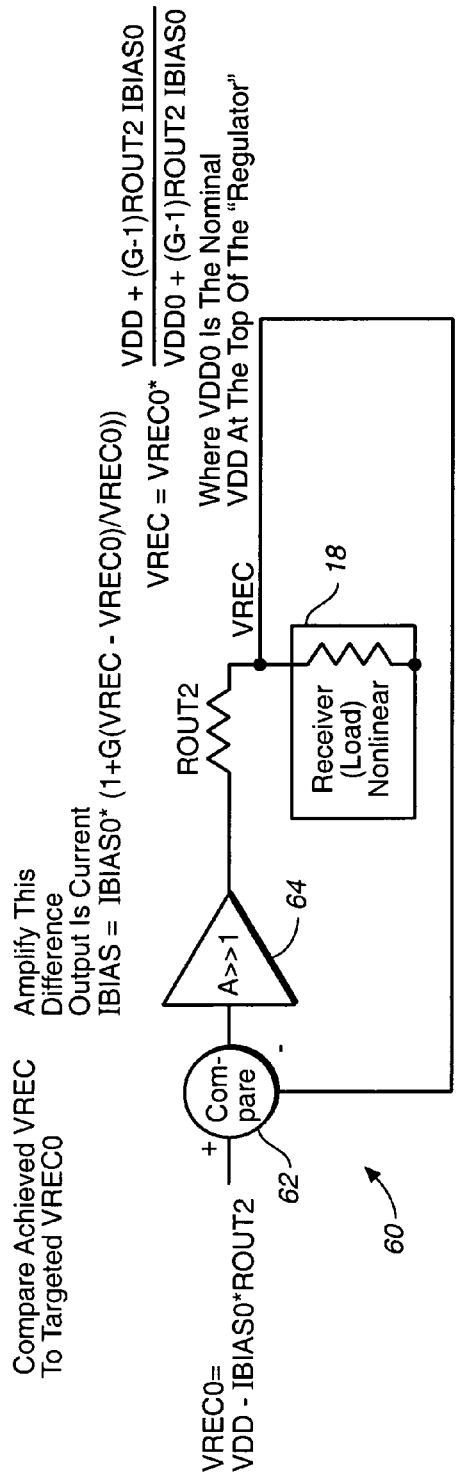
FIG._9

RESISTIVE VOLTAGE-DOWN REGULATOR FOR INTEGRATED CIRCUIT RECEIVERS

FIELD OF THE INVENTION

The present invention relates to semiconductor integrated circuits and more particularly to power supplies for powering receivers constructed out of low voltage semiconductor devices.

BACKGROUND OF THE INVENTION

In a typical communication system, analog (or digital) signals are transmitted from a transmitter to a receiver through a transmission channel. For example, the transmitted signal can include a differential signal transmitted through a twisted pair of transmissions lines. The transmission lines are coupled to a receiver that is fabricated on an integrated circuit for decoding the transmitted signals into single-ended or complementary analog or digital output signals.

In the design of high performance receivers, it would be advantageous if the fastest, smallest transistors available for the technology in which the integrated circuit is fabricated could be used. This would achieve the highest switching speed while consuming the least area and the least power. However, the fastest transistors that are available in a given technology are often low-voltage transistors, which may have voltage ratings that are lower than the power supply for the integrated circuit. If the available power supply has a higher output voltage than the voltage rating of the transistors used to form the receiver, the most common solution is to use a voltage regulator for reducing the original power supply output voltage to a lower voltage that can be used for powering the receiver. However as power supply voltages and transistor voltage ratings continue to reduce, it becomes very difficult and complex to build full voltage regulators that can regulate voltages accurately at these small levels within sufficient tolerances.

For example if the original power supply voltage, VDD, has a tolerance of ±10%, then the reduced voltage produced by the voltage regulator would also have a tolerance of ±10, plus whatever inaccuracies are introduced by the voltage regulator. These inaccuracies can result from operational amplifier offset voltages and resistor mismatches, for example. A reasonable expectation would be that the reduced voltage at the output of the regulator would have a tolerance of about ±12% of the target voltage. This tolerance is quite large and can pose problems for low power supply voltages that are just above the sum of the N-channel and P-channel threshold voltages of the transistors in the receiver.

Improved regulators are therefore desired for biasing high speed, low-voltage receivers so as to reduce the overall range of bias currents in the receiver and provide tighter electrical response at the output of the receiver.

SUMMARY OF THE INVENTION

One embodiment of the present invention is directed to an integrated circuit, which includes first and second power supply terminals, a ground supply terminal, a resistive element coupled between the first and second power supply terminals, and a receiver biased between the second power supply terminal and the ground supply terminal. The receiver draws a bias current through the resistive element, which varies as a positive function with a voltage on the second power supply terminal. The voltage on the second power supply terminal varies as an inverse function of the bias current.

Another embodiment of the present invention is directed to an integrated circuit, which includes first and second power supply terminals, and a ground supply terminal. A resistive voltage-reducing circuit is coupled between the first and second power supply terminals for producing a voltage on the second power supply terminal, which is less than a voltage on the first power supply terminal and for varying the voltage on the second power supply terminal as an inverse function of a bias current. A receiver is biased between the second power supply terminal and the ground supply terminal. The receiver draws the bias current through the resistive voltage-reducing means as a positive function of the voltage on the second power supply terminal.

BRIEF DESCRIPTION OF THE DRAWINGS

FIG. 1 is a schematic diagram illustrating a typical voltage regulator of the prior art for biasing a complementary metal oxide semiconductor (CMOS) receiver.

FIG. 2 is a schematic diagram illustrating an example of the receiver shown in FIG. 1 in greater detail.

FIG. 3 is a schematic diagram illustrating a resistive voltage-down reducer or "regulator", according to one embodiment of the present invention.

FIG. 4 is a schematic diagram illustrating a resistive voltage-down reducer according to an alternative embodiment of the present invention.

FIG. 5 is a schematic diagram illustrating a resistive voltage-down reducer according to another alternative embodiment of the present invention.

FIG. 6 is a graph illustrating a receiver bias voltage as a function of time over various process, voltage and temperature conditions for the resistive voltage reducer shown in FIG. 3.

FIG. 7 is a graph illustrating a bias current drawn by the receiver as a function of input voltage over various process, voltage and temperature conditions for the resistive voltage reducer shown in FIG. 3.

FIG. 8 is a schematic diagram illustrating an equivalent circuit showing feedback in the receiver circuit shown in FIG. 1.

FIG. 9 is a schematic diagram illustrating an equivalent circuit showing feedback in the receiver circuits shown in FIGS. 3-5 according to some embodiments of the present invention.

DETAILED DESCRIPTION OF ILLUSTRATIVE EMBODIMENTS

FIG. 1 is a schematic diagram illustrating a typical voltage regulator 10 for biasing a complementary metal oxide semiconductor (CMOS) receiver 12 according to the prior art. Regulator 10 and receiver 12 are fabricated on an integrated circuit having a voltage supply rail VDD and a ground supply rail GND. Receiver 12 is constructed with low voltage transistors, which have voltage ratings that are lower than the voltage supplied between rails VDD and GND. In order to prevent damage to the transistors within receiver 12, voltage regulator 10 generates a regulated voltage VREC, which is lower than VDD and can be used for biasing receiver 12. For example, voltage supply rail VDD may have a voltage of 1.8 volts, while receiver 12 requires a bias voltage of 1.5 volts or less on bias node VREC.

Voltage regulator 10 includes bias resistors R1 and R2, operational amplifier 14 and N-channel transistor MN1. Resistors R1 and R2 are coupled in series with one another between VDD and GND. The non-inverting input of amplifier 14 is coupled to the node between resistors R1 and R2. The inverting input of amplifier 14 is coupled to VREC and the source of transistor MN1. The output of amplifier 14 is coupled to the gate of transistor MN1. Transistor MN1 is coupled in series between VDD and VREC. Operational amplifier 14 is coupled with MN1 as a voltage follower, wherein the ratio of the resistances between resistor R1 and R2 determine the gate voltage applied to transistor MN1 such that the voltage on VREC equals the reference voltage, VREF, at the node between R1 and R2. Receiver 12 is biased between VREC and GND. Receiver 12 has differential inputs V+ and V− and produces a differential or single-ended output VOUT.

In the example shown in FIG. 1, the voltage on VDD has a tolerance of ±10%. The reduced voltage on VREC would therefore also have a tolerance of ±10%, plus any inaccuracies introduced by the offset voltages of amplifier 14 and mismatches in resistors R1 and R2. A reasonable expectation would be that the reduced voltage on VREC would have a tolerance of about ±12%. Such a large tolerance can provide inaccuracies at the output of receiver 12, particularly when a receiver design is used that is biased in a manner where the internal bias currents drawn by the receiver are very strong functions of the power supply voltage. This is particularly true for low power supply voltages that are just above the sum of the N-channel and P-channel threshold voltages in the receiver. Thus, large tolerances in the bias voltage for the receiver can result in even larger tolerances at the output of the receiver.

FIG. 2 is a schematic diagram illustrating an example of receiver 12 in greater detail. However, many other types and designs of receivers can be powered by regulator 10 in alternative embodiments of the present invention. For example, the regulator can be used to power any receiver design having a power supply bias current that is a strong function of the power supply voltage.

Receiver 12 is an example of one type of receiver design that has a bias current that is a very strong function of the power supply voltage. Receiver 12 includes N-channel transistors MN2-MN7 and P-channel transistors MP1-MP5. These transistors can be low-voltage transistors, high-voltage transistors or a combination of both low- and high-voltage transistors. Transistor MN2 forms a tail current source, which provides a tail current ITAIL as a function of the voltage on VBIAS. Transistors MN3 and MN4 form a differential transistor pair for steering ITAIL into transistors MP1 and MP2 as a function of the relative voltage levels on differential inputs V− and V+, respectively.

Transistors MP2 and MP4 form a current mirror for mirroring the current developed in the drain of transistor MP2 into the drain of transistor MP4. Transistors MP1 and MP3 form a current mirror for mirroring the current developed in the drain of transistor MP1 to the drain of transistor MP3. Transistors MN5 and MN6 mirror the current in the drain of transistor MP3 to the drain of transistor MN6. The drains of transistors MP4 and MN6 are coupled to receiver output VOUT such that MP4 and MN6 act as pull up and pull down output drivers that drive the voltage on VOUT as a function of the relative voltage levels on V+ and V−.

The bias voltage BVIAS is set by P-channel transistor MP5 and N-channel transistor MN7, which are connected as reverse-coupled diodes in series with one another between VREC and GND. VBIAS is coupled to the node between MP5 and MN7.

As mentioned above, the internal bias current drawn by receiver 12 is a very strong function of VREC. This is especially true if VREC is close in value to the sum of turn-on voltages VTN and VTP of transistors MP5 and MN7. As VREC rises, VBIAS rises, which increases ITAIL and thus increases the current drawn by receiver 12.

In one embodiment of the present invention, the traditional voltage regulator is replaced by a resistive voltage-down reducer or "regulator", which takes advantage of the internal bias current of the receiver being a very strong function of VREC such that the reducer can be significantly simplified while its performance is improved.

FIG. 3 is a schematic diagram illustrating a receiver circuit having a resistive voltage reducer, according to one embodiment of the present invention. The receiver circuit includes a resistive element 20 and a receiver 22. In this embodiment, resistive element 20 includes P-channel transistor MP6, which is coupled in series between voltage supply rail VDD and reduced, voltage supply rail VREC. Transistor MP6 has a gate coupled to bias voltage V1, a source coupled to VDD and a drain coupled to VREC. In one embodiment, bias voltage V1 is set to place MP6 in its linear current-voltage operating mode so as to act a controlled resistance. For example, V1 can be coupled to GND during normal operation and can be decoupled from GND during power down to turn off receiver 22.

Receiver 22 is biased between VREC and GND and is constructed from low-voltage devices. Receiver 22 can include any suitable receiver where the bias current drawn by the receiver is a strong function of the voltage on VREC. In one embodiment, the bias current drawn by receiver 22 has a greater than linear dependence on VREC. For example, receiver 22 can include receiver 12 shown in FIG. 2 or any other suitable receiver type, such as an inverter or a Schmitt trigger.

As described in more detail below, the combination of a resistive element 20 as voltage reducer and a receiver having a bias current that is a very strong function of VREC provides a negative feedback, which tends to provide excellent voltage control on VREC, in contrast to traditional voltage regulators. If the voltage level on VREC rises due to tolerances on VDD or other process, temperature or voltage conditions, the bias current IBIAS drawn by receiver 22 rapidly increases, tending to pull VREC back down through the increased voltage drop across resistive element 20. If the voltage on VREC falls, the bias current IBIAS drawn by receiver 22 rapidly decreases, tending to pull VREC back up. This type of feedback is significantly inhibited in a regulated-type of voltage-down regulator, such as that shown in FIG. 1.

Also, the use of a P-channel transistor allows resistive element 20 to reduce small values of VDD to lower voltages, particularly voltages that are close to the threshold voltages of the transistors in the receiver. For example, resistive element 20 can easily reduce a voltage of 1.8 volts on VDD to 1.5 volts on VREC. This cannot be done with traditional voltage regulators, such as that shown in FIG. 1, if the regulator is trying to drop less voltage than the back-biased threshold voltage of the source-follower transistor (or emitter-follower transistor in a BJT transistor design).

FIG. 4 is a schematic diagram illustrating a resistive element 24 according to alternative embodiment of the present invention. In this embodiment, resistive element 24 includes a resistor R3, which is coupled between VDD and VREC. Resistor R3 can include any type of resistive element or elements that can be fabricated on an integrated circuit.

FIG. 5 is a schematic diagram illustrating a resistive element 26 according to another alternative of the present invention. In this embodiment, resistive element 26 includes P-channel transistor MP6 and resistor R3, which are coupled in series with one another between VDD and VREC. Other types of resistive elements can also be used in alternative embodiments of the present invention. In addition, the resistive element can be coupled on the power side of the receiver as shown in FIGS. 3-5 or on the ground side of the receiver, if desired.

In each of the embodiments shown in FIG. 3-5, the resistive voltage reducer does not a source a "constant voltage", but reduces the power supply voltage to a desired range on VREC, such that low-voltage devices can be used within the receiver. The resistive element consumes significantly less area and power on the integrated circuit than the regulator shown in FIG. 1 and is significantly less complex. In many embodiments, the resistive element reduces the overall range of bias currents drawn by the receiver and therefore provides better regulation than a true voltage regulator would provide. This results in a tighter electrical response at the output of the receiver.

FIG. 6 is a graph illustrating the voltage on VREC for the embodiment shown in FIG. 3 as a function of time for a range of 360 different process, voltage and temperature conditions. In this example, VDD was 1.8V±10% and resistive element 20 reduced the voltage on VREC to 1.4V±12.8%. This is approximately the same result as if a full regulator had been used, but significantly less circuitry was used to generate the reduced voltage.

As mentioned above, the use of a resistive element as a "regulator" instead of a true voltage regulator reduces the range of bias currents drawn by the receiver. FIG. 7 is a graph illustrating the bias current IBIAS drawn by the receiver as a function of an input voltage applied to the non-inverting data input V+ of the receiver for a sweep of different values of VRCE. In this example, the goal was to reduce the voltage on VDD from 1.8V±100 to 1.5V±10% on VRCE. When the receiver was powered directly from a 1.5V±10% voltage source, the range of bias currents across variations in process, temperature and voltage was 0.9 mA to 4.7 mA. When the receiver was powered instead off of 1.8V±10% through the resistive "regulator" shown in FIG. 3, the range of bias currents IBIAS drawn by the receiver across the variations in process, temperature and voltage was 1.3 mA to 4.2 mA even though the reduced voltage on VCE was 1.4V±12.8%. Thus, the negative feedback characteristic of a resistive voltage-down "regulator" when used with a receiver that draws a bias current that is a strong function of VDD results in a reduction of the range of bias currents drawn by the receiver.

FIGS. 8 and 9 illustrate the feedback topography of the traditional voltage down-regulator (shown in FIG. 1) and the resistive voltage reducers (shown in FIGS. 3-5), respectively. In FIG. 8, equivalent circuit 50 has a comparison element 52, an amplifier 54, an output resistance ROUT1, and the receiver 12. Receiver 12 has a load resistance RLOAD. Comparison element 52 has a non-inverting input coupled to VREF and an inverting, feedback input coupled to VREC. The output of comparison element 52 represents a difference between the achieved VREC and the target VREF. Amplifier 54 amplifies this difference by an open loop gain factor A, which is much greater than 1. Output resistor ROUT1 represents the output resistance of the regulator.

The voltage developed on VREC is given by the following equation:

$$VREC = VREF/(1+1/(A\beta)) \quad \text{EQ. 1}$$

where A is the open loop gain of amplifier 54 and β is the closed loop negative feedback gain. The closed-loop gain is given by:

$$\beta = RLOAD1/(RLOAD+ROUT1) \quad \text{EQ. 2}$$

In the traditional regulator circuit shown in FIG. 1, the tolerance on VREC cannot be better than the tolerance on VREF, and VREF is usually based on VDD. For example, if VDD and VREF have a tolerance of ±10% then the tolerance on VREC will be at least ±10%.

FIG. 9 illustrates the feedback topography of the embodiments shown in FIGS. 3-5. Although not explicitly shown in FIGS. 3-5, these embodiments have feedback from the voltage developed on VREC. In these embodiments, the resistive element and receiver have the following characteristics:

1. The nominal bias current IBIAS is:

$$IBIAS0 = (VDD-VREC0)/ROUT2 \quad \text{EQ. 3}$$

where VREC0 is the targeted voltage to the receiver and the receiver draws IBIAS0 at this voltage, and where ROUT2 is the resistance of the resistive element; and 2. The self-bias current IBIAS drawn by receiver 18 is a strong function of VREC, such as in the following example:

$$IBIAS = IBIAS0*(1+G(VREC-VREC0)/VREC0) \text{ and}$$
$$G > 1 \quad \text{EQ. 4}$$

where IBIAS is the actual current drawn by the receiver, G is the system closed-loop gain, and VREC0 is the targeted voltage on VREC.

As shown in FIG. 9, the equivalent circuit 60 has a comparison element 62, an amplifier 64, an output resistance ROUT2 and the receiver 18. Comparison element 62 compares the targeted VREC0 to the achieved, actual VREC and applies the difference to amplifier 64. The targeted VREC0 can be defined as, $$VREC0 = VDD - IBIAS0*ROUT2 \quad \text{EQ. 5}$$

Amplifier 64 amplifies this difference and outputs bias current IBIAS, which is the bias current drawn by receiver 18. This bias current is drawn through the resistive voltage-down "regulator" resistance ROUT2 and follows the relation shown above for IBIAS, for example. The resulting voltage on VREC is fed back to comparison element 62.

With the embodiments shown in FIGS. 3-5, the voltage on VREC follows the following relation:

$$VREC = VREC0 * \frac{VDD + (G-1)ROUT2*IBIAS0}{VDD0 + (G-1)ROUT2*IBIAS0} \quad \text{EQ. 6}$$

where VDD0 is the nominal voltage on VDD at the top of the resistive element.

For a closed-loop gain that is greater than 1, the tolerance on VREC is tighter than the tolerance on VDD. For example, if the voltage of VDD increases, the voltage on VREC will also tend to increase. However, according to Equation 4, as VREC increases the self-bias current IBIAS that is drawn by receiver 18 also increases. The increase in IBIAS then tends to increase the voltage drop across ROUT2, which tends to reduce VREC or at least limit its increase. This operation is confirmed by the results shown in FIGS. 6 and 7.

Although the present invention has been described with reference to preferred embodiments, workers skilled in the art will recognize that changes may be made in form and detail without departing from the spirit and scope of the invention.

What is claimed is:

1. An integrated circuit comprising:
   first and second power supply terminals;
   a ground supply terminal;
   a resistive element coupled between the first and second power supply terminals, wherein the voltage on the second power supply terminal varies in part as a positive function of the voltage on the first power supply terminal and in part as an inverse function of a bias current drawn through the resistive element; and a receiver biased between the second power supply terminal and the ground supply terminal, wherein the receiver draws the bias current through the resistive element, which varies as a positive function with a voltage on the second power supply terminal and has a greater than linear dependence on the voltage on the second power supply terminal such that changes in the bias current limit changes in the voltage on the second power supply terminal through the resistive element due to changes in the voltage on the first power supply terminal.

2. The integrated circuit of claim 1 wherein the resistive element comprises a resistor coupled in series between the first and second power supply terminals.

3. The integrated circuit of claim 2 wherein the resistive element consists solely of a resistor coupled in series between the first and second power supply terminals.

4. The integrated circuit of claim 1 wherein the resistive element comprises a transistor coupled in series between the first and second power supply terminals.

5. The integrated circuit of claim 4 wherein the resistive element consists solely of a transistor coupled in series between the first and second power supply terminals.

6. The integrated circuit of claim 4 wherein the transistor comprises a P-channel transistor biased in the linear region of the transistor.

7. The integrated circuit of claim 1 wherein the resistive element consists solely of a resistor and a transistor coupled in series with one another between the first and second power supply terminals.

8. The integrated circuit of claim 1, wherein the receiver comprises a differential transmission line receiver comprising first and second differential receiver inputs and a receiver output.

9. An integrated circuit comprising:
first and second power supply terminals;
a ground supply terminal;
resistive voltage-reducing means coupled between the first and second power supply terminals for producing a voltage on the second power supply terminal, which is less than a voltage on the first power supply terminal and for varying the voltage on the second power supply terminal in part as a positive function of the voltage on the first power supply terminal and in part as an inverse function of a bias current such that changes in the bias current limit changes in the voltage on the second power supply terminal due to changes in the voltage on the first power supply terminal; and
a receiver biased between the second power supply terminal and the ground supply terminal, wherein the receiver draws the bias current through the resistive voltage-reducing means as a positive function of the voltage on the second power supply terminal and wherein the bias current drawn by the receiver through the resistive voltage-reducing means has a greater than linear dependence on the voltage on the second power supply terminal.

10. The integrated circuit of claim 9 wherein the resistive voltage-reducing means comprises a resistor coupled in series between the first and second power supply terminals.

11. The integrated circuit of claim 10 wherein the resistive voltage-reducing means consists solely of a resistor coupled in series between the first and second power supply terminals.

12. The integrated circuit of claim 9 wherein the resistive voltage-reducing means comprises a transistor coupled in series between the first and second power supply terminals.

13. The integrated circuit of claim 12 wherein the resistive voltage-reducing means consists solely of a transistor coupled in series between the first and second power supply terminals.

14. The integrated circuit of claim 12 wherein the transistor comprises a P-channel transistor biased in a linear region of the transistor.

15. The integrated circuit of claim 9 wherein the resistive voltage-reducing means consists solely of a resistor and a transistor coupled in series with one another between the first and second power supply terminals.

16. The integrated circuit of claim 9, wherein the receiver comprises a differential transmission line receiver comprising first and second differential receiver inputs and a receiver output.

17. An integrated circuit comprising:
first and second power supply terminals;
a ground supply terminal;
a resistive element coupled between the first and second power supply terminals, wherein the voltage on the second power supply terminal varies in part as a positive, greater than linear function of the voltage on the first power supply terminal and in part as an inverse function of a bias current drawn through the resistive element, wherein changes in the voltage on the second power supply terminal due to changes in the voltage on the first power supply terminal are limited by corresponding changes in the bias current, and wherein the voltage on the second power supply terminal has a smaller variance than corresponding changes in the voltage on the first power supply terminal; and
a differential transmission line receiver biased between the second power supply terminal and the ground supply terminal, wherein the receiver draws the bias current through the resistive element, which varies as a positive, stronger than linear function with a voltage on the second power supply terminal.

* * * * *